US005325052A

United States Patent [19]
Yamashita

[11] Patent Number: 5,325,052
[45] Date of Patent: Jun. 28, 1994

[54] PROBE APPARATUS

[75] Inventor: Satoru Yamashita, Kofu, Japan

[73] Assignee: Tokyo Electron Yamanashi Limited, Nirasaki, Japan

[21] Appl. No.: 943,492

[22] Filed: Sep. 11, 1992

Related U.S. Application Data

[63] Continuation-in-part of Ser. No. 800,001, Nov. 29, 1991, Pat. No. 5,266,895.

[30] Foreign Application Priority Data

Nov. 30, 1990 [JP] Japan .................................. 2-339803

[51] Int. Cl.$^5$ ...................... G01R 1/073; G01R 31/02
[52] U.S. Cl. .............................. 324/158 P; 324/158 F
[58] Field of Search ................. 324/158 P, 158 F, 72.5

[56] References Cited

U.S. PATENT DOCUMENTS 5,077,523 12/1991 Blanz ................................ 324/158 P
5,124,639 6/1992 Carlin et al. ....................... 324/158 P
5,198,753 3/1993 Hamburgen .................... 324/158 P

FOREIGN PATENT DOCUMENTS 3-224246 10/1991 Japan .

Primary Examiner—Ernst F. Karlsen
Attorney, Agent, or Firm—Oblon, Spivak, McClelland, Maier & Neustadt

[57] ABSTRACT

A probe apparatus comprises a vertically movable table for placing a semiconductor wafer having semiconductor devices, a heater for heating the wafer at a predetermined temperature, and a probe card located above the wafer and having support and positioning portions for probes. The probe has a vertical portion which extends downward substantially vertically, and is capable of buckling. Two positioning plates are supported by the support positioning portion through which the vertical portions of said probes are downwardly extended wherein a temperature controller heats the probes at the positioning plates at a predetermined temperature.

9 Claims, 3 Drawing Sheets

PROBE APPARATUS

CROSS-REFERENCE TO THE RELATED APPLICATION

The present invention is a continuation-in-part application of U.S. application Ser. No. 800,001, filed on Nov. 29, 1991, now U.S. Pat. No. 5,266,895.

BACKGROUND OF THE INVENTION

1. Field of the Invention

The present invention relates to a probe apparatus for measuring electrical characteristics of a semiconductor device.

2. Description of the Related Art

As is known, a large number of semiconductor devices are formed on a semiconductor wafer by using a high precision photographic transfer technique, and the wafer is incised in units of semiconductor devices. In such a semiconductor device manufacturing process, conventionally, the electrical characteristics of a semiconductor device as a semifinished product are tested and discriminated by using a probe apparatus upon mounting of the semiconductor device on the semiconductor wafer. Only the semiconductor devices that are determined to be non-defective from the result of the testing measurement are sent to the following steps, e.g., packaging, thus improving the productivity.

The probe apparatus has a wafer holding table movable in the X-Y-Z-θ directions. A probe card having a large number of probes corresponding to the electrode pads of the semiconductor devices is fixed above the wafer holding table. The semiconductor wafer is set on the wafer holding table, the wafer holding table is driven to bring the electrodes of the semiconductor devices into contact with the probes, and testing measurement is performed through the probes.

In recent years, it has been attempted to perform the testing measurement as described above at a high temperature by providing a temperature control mechanism to the wafer holding table and heating the semiconductor wafer placed on the wafer holding table. In this case, heat from the wafer holding table is transferred to the probe card. Then, the probe card is sometimes deformed to displace the positions of the probes, thus disabling high-precision measurement. As an apparatus to solve this problem, an apparatus disclosed in, e.g., U.S. Pat. No. 5,124,639, is known. In this apparatus, a heating device is provided also to the probe card holding mechanism to preheat the probe card to a temperature similar to that of the semiconductor wafer. In this known apparatus, the heating device is provided to the support means for supporting the intermediate portions of the probes extending obliquely from the probe card. The inclination of the probes is controlled by this heating device, thereby positioning the distal ends of the styluses.

The packing density of the semiconductor devices has been increased recently, and the pitch of electrode pads of the semiconductor devices has been decreased and the number of electrodes pads of the semiconductor devices has been increased. Therefore, as disclosed in Published Unexamined Japanese Patent Application No. 3-224246 a probe card in which probes are arranged substantially vertically has been developed for practical applications to replace the probe card in which probes are arranged obliquely.

In the probe card having the vertical probes, the problem concerning the testing measurement at a high temperature is not solved. Thus, measurement of such vertical probe must be performed at a normal temperature.

SUMMARY OF THE INVENTION

It is an object of the present invention to provide a probe apparatus which is capable of performing measurement by vertical probes with high precision at a temperature other than a normal temperature, like testing measurement at a high temperature, and which is hence suitable to measurement of semiconductor wafers having a high packing density.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

DETAILED DESCRIPTION OF THE PREFERRED EMBODIMENTS

A probe apparatus according to the preferred embodiment of the present invention will be described with reference to the accompanying drawings.

Figure 1:
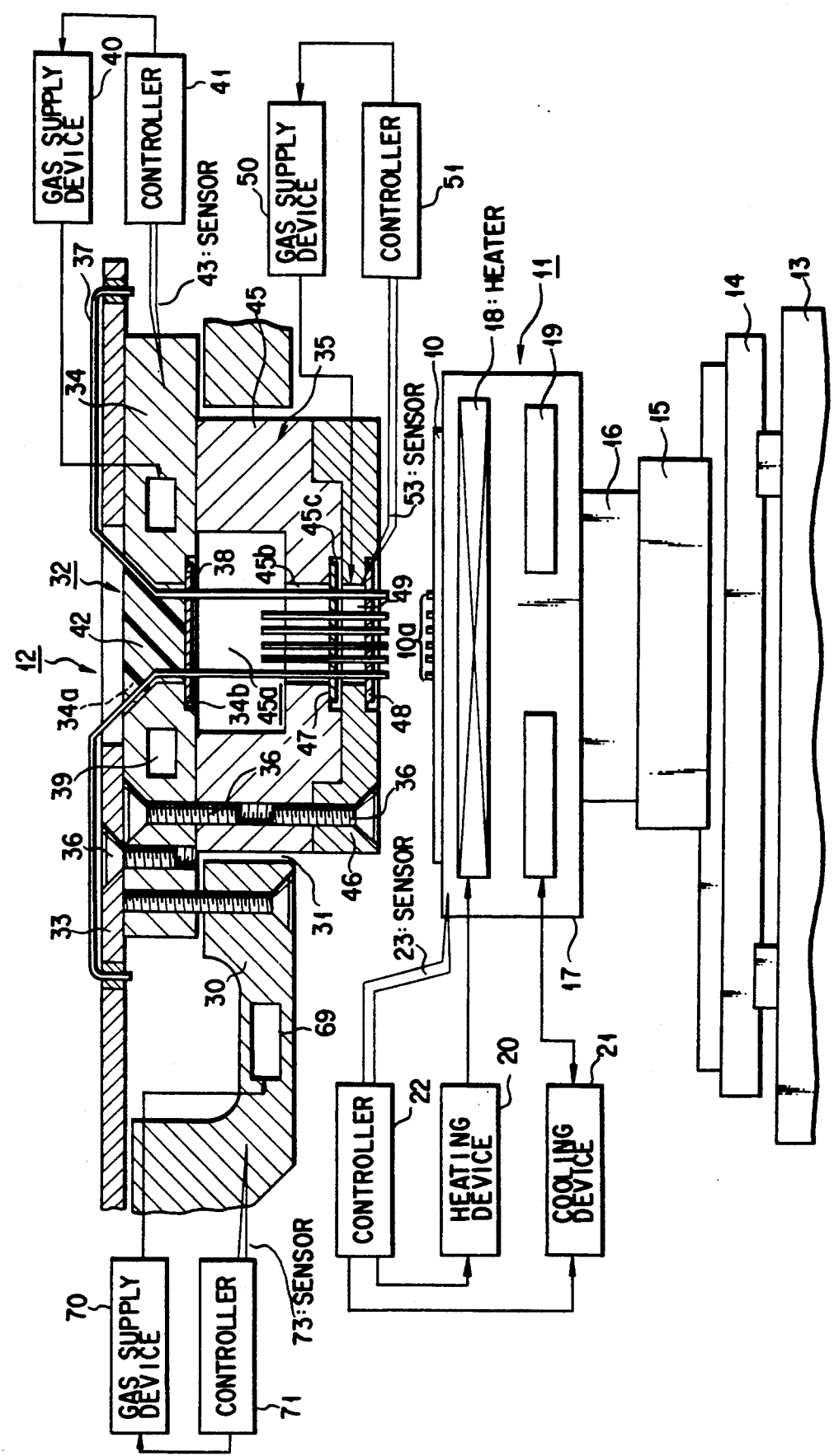
FIG. 1 is a view schematically showing a probe apparatus according to an embodiment of the present invention.
Figure 2:
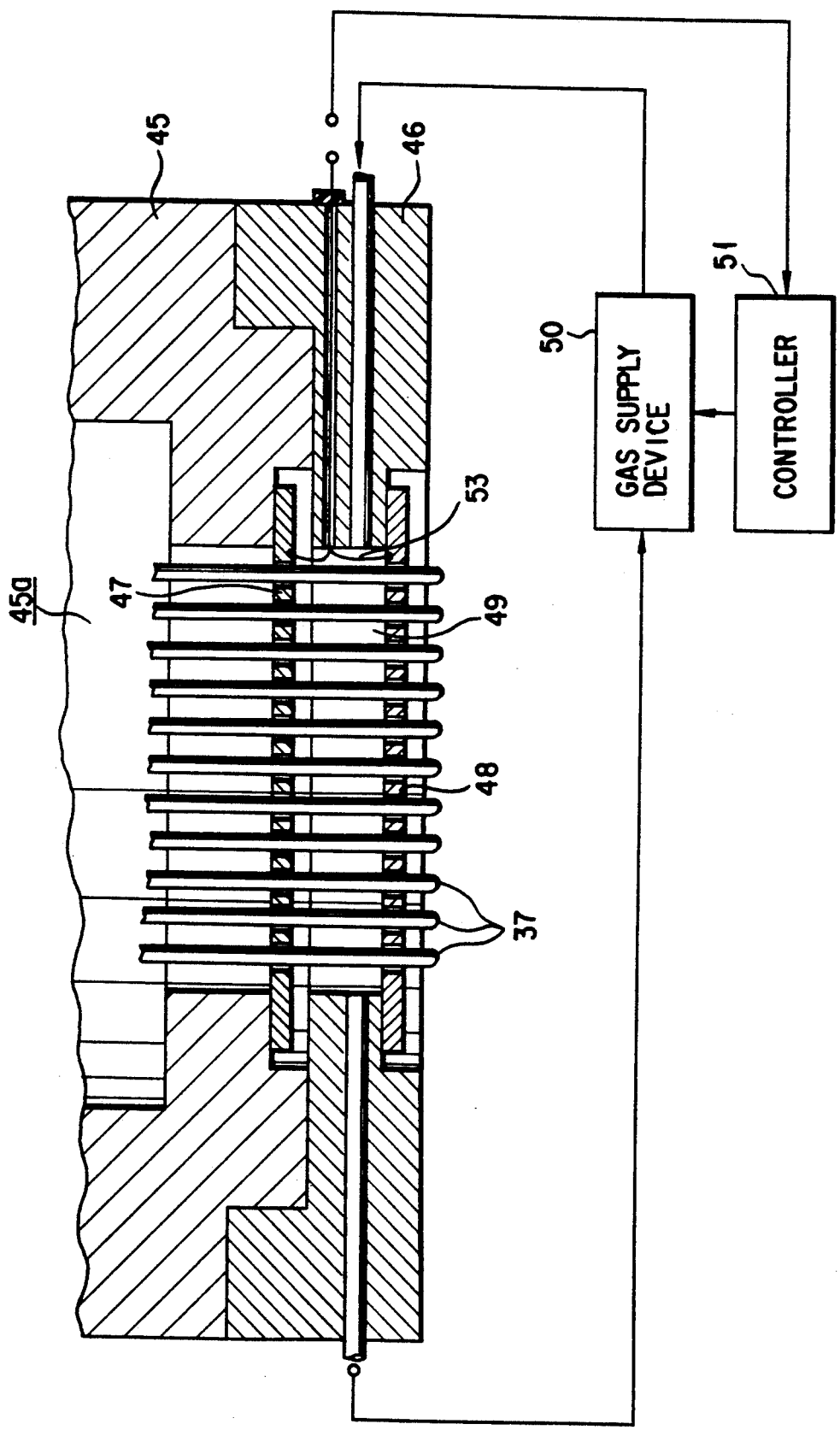
FIG. 2 is a partial enlarged view of the apparatus of FIG. 1.

The probe apparatus comprises a wafer rest table 11 and a probe card mechanism 12, as shown in FIG. 1. A semiconductor wafer 10 on which a large number of semiconductor devices having a large number of electrode pads 10a on their upper surfaces are formed is placed on the wafer rest table 11. The wafer rest table 11 is movable in the X-Y-Z-θ directions.

The rest table 11 has X and Y stages 14 and 15. The X stage 14 is fixed on the upper surface of a base table 13 and movable in the X direction along two rails extending in the X direction to be parallel to each other. The Y stage 15 is movable on the X stage 14 in the Y direction along two rails extending in the Y direction. The X and Y stages 14 and 15 are driven within a horizontal plane in the X and Y directions by a known driving mechanism including a pulse motor and the like. A vacuum chuck 17 is provided on the Y stage 15 through a θ stage 16 rotatable about the Z axis (vertical axis). The θ stage 16 and the vacuum chuck 17 are driven by a known mechanism.

A large number of holes are formed in the upper surface of the vacuum chuck 17, and the semiconductor wafer 10 is chucked on the upper surface of the vacuum chuck 17 by a pressure-reducing mechanism (not shown) through these holes. The vacuum chuck 17 is made of a material, e.g., stainless steel which has a high thermal conductivity, and a heater 18 and a cooler or a cooling jacket 19 for selectively heating or cooling the vacuum chuck 17 are incorporated in the vacuum chuck 17. The heater 18 is constituted by, e.g., a heat coil, and the radiation temperature is adjusted by controlling current supplied to the heater 18. In this embodiment, the heat coil is connected to a power supply or heating device 20 provided outside the vacuum chuck 17 through a wire, so that the current is supplied from the power supply or heating device 20 to the coil.

The cooler 19 is constituted by a conduit which is buried in the vacuum chuck 17 and through which a cooling fluid, e.g., a cooling gas and a cooling water, flows. The inlet and outlet ports of the conduit are connected to the outlet and inlet ports, respectively, of a cooling device 21 through pipes. When the cooling fluid is circulated between the cooling device 21 and the cooler 19, the vacuum chuck 17 can be cooled to a predetermined temperature. The cooling device 21 and the power supply 20 cause the corresponding temperature control members 19 and 18 to perform cooling or heating to a desired temperature on the basis of an output signal from a controller 22. The temperature control mechanism of the vacuum chuck 17 is thus constituted. The controller 22 outputs a signal in response to a temperature detection signal supplied from a temperature sensor 23 for detecting the temperature of the vacuum chuck 17. In this embodiment, the output signal from the controller 22 is supplied to the power supply 20 to control the current to be supplied to the heater 18, and is simultaneously supplied to the cooling device 21 to control the temperature or the flow amount of the fluid to be supplied to the cooler 19.

The probe card mechanism 12 has a support ring 30 which is fixed on a probe apparatus body (not shown) to be located above the wafer rest table 11 and which has a opening 31 at its central portion. A probe card 32 is exchangeably supported on the probe ring 30 to oppose the semiconductor wafer 10 supported on the wafer rest table 11 at a predetermined gap. The probe card 32 has a printed board portion 33, a probe support portion 34, and a probe positioning portion 35 which have disk-like shapes, are coaxially stacked on each other, and are fixed with each other by bolts 36. The probe support portion 34 located at the intermediate portion has an onter configuration larger than that of the probe positioning portion 35 therebelow. When the peripheral step defined by the portions 34 and 35 in this manner is placed on the upper surface of the support ring 30 near its opening, the probe card 32 is supported on the support ring 30 such that its probe positioning portion 35 extends downward through the opening 31. The printed board portion 33 is made of a synthetic resin and has an electric wiring on its upper surface. A large number of through holes are formed near the outer periphery of the printed board portion 33. The proximal ends of a large number of probes 37 are inserted in these through holes. The probes 37 are fixed to the printed board portion 33 at their proximal ends by a solder. The proximal ends of the probes 37 are electrically connected to the electrical wiring. The contact pins of a tester are respectively connected to the electrical wiring, thereby performing testing measurement of the semiconductor wafer 10 to be described later. The probes 37 extend on the upper surface of the printed board portion 33 from almost their proximal end portions toward the central portion of the printed board portion 33 to be parallel to each other at predetermined gaps. The intermediate portions of the probes 37 are bent downward to extend downward through the central opening of the printed board portion 33. The probes 37 are further bent at a central opening 34a of the probe support portion 34 to extend vertically from the lower end of the probe positioning portion 35.

The probe support portion 34 is made of a metal having a high rigidity, e.g., SUS (stainless steel) suppress the deformation of the probe due to the pressure applied to the tip thereof and increase the degree of a parallel relationship between the table 11 and card 32. The wall surface defining the central opening 34a which is formed at the central portion of the probe support portion 34 and through which the probes 37 extend forms an inclined surface corresponding to the inclined buckle portions of the probes 37, and has a slight gap with respect to the probes 37. A recess 34b having a diameter larger than that of the central opening 34a and coaxial with the central opening 34a is formed in the central portion of the lower surface of the probe support portion 34. A fixing plate 38 is mounted on the support portion 34 in the recess 34b to close the lower end of the central opening 34a. A large number of through holes aligned with a predetermined pattern are formed in the fixing plate 38, and the probes 37 extend through the through holes. In this state, a synthetic resin 42, e.g., an epoxy resin, is filled in the central opening 34a and cured to fix the intermediate portions of the probes 37 with the probe support portion 34.

A heater/cooler or air jacket 39 is formed in the probe support portion 34. The inlet and outlet ports of the heater/cooler 39 are connected to the outlet and inlet ports, respectively, of a gas supply device 40 through pipes. When a gas heated or cooled to a predetermined temperature is circulated between the heater/cooler 39 and the gas supply device 40, the probe support portion 34 can be set at a predetermined temperature. The gas supply device 40 causes the heater/cooler 39 to perform cooling or heating to a desired temperature on the basis of an output signal from a controller 41. The controller 41 outputs a signal in response to a temperature detection signal supplied from a temperature sensor 43 for detecting the temperature of the probe support portion 34. The temperature control mechanism of the probe card 32, especially of the printed board portion 33 and the probe support portion 34, is thus constituted. In this embodiment, the output signal from the controller 41 controls the temperature or flow amount of the fluid to be supplied to the heater/cooler 39.

The probe positioning portion 35 is made of a metal, e.g., brass, and has an upper portion 45 having an upper surface mounted on the lower surface of the probe support portion 34, and a lower portion 46 having an upper surface mounted on the lower surface of the upper portion 45 and a lower surface from which the distal ends of the probes 37 extend downward. A through hole constituted by three concentrical portions 45a, 45b, and 45c having different diameters is formed in the central portion of the upper portion 45. The upper two portions 45a and 45b are set relatively long so that the probes 37 can buckle in them, as will be described later. The lower portion 45c has a diameter larger than that of the middle portion 45b, and a first positioning plate 47 is mounted on the portion 45 in the lower through hole portion 45c to close the lower end of the middle portion 45b. A through hole constituted by two portions 46a and 46b concentric with the circular through hole in the upper portion 45 and having different diameters is formed in the central portion of the lower portion 46. The lower portion 46b has a diameter larger than that of the upper portion 46a, and a second positioning plate 48 is mounted in the lower portion 46b to close the lower end of the upper portion 46a.

Hence, of the central through hole in the upper portion 45, the space sandwiched between the first and second positioning plates 47 and 48 is defined as an air jacket 49.

A large number of through holes are formed in each of the positioning plates 47 and 48, and the lower portions of the probes 37 are inserted in these through holes. To assemble the probe card 32, the intermediate portions of the probes 37 are fixed to the probe support portion 34 by filling the synthetic resin 42 in the opening 34a, and thereafter the positioning plates 47 and 48 through which the distal end portions of the probes 37 are inserted are mounted on the upper and lower portions 45 and 46, respectively, so that the tips of the probes 37 are maintained at predetermined positions by the upper and lower portions 45 and 46.

Each of the positioning plates 47 and 48 is constituted by an electrically insulating thin plate, and is constituted by a thin plate made of a synthetic resin, glass, or a ceramic having a thickness of about 0.3 mm in this preferred embodiment. The diameter of each of the through holes which are formed in the upper and lower portions 45 and 46 and through which the probes 37 are inserted is preferably set larger than that of the diameter of each probe 37 by about 10 $\mu$m, and is preferably, e.g., 80 to 110 $\mu$m when the probes 37 each having a diameter of 70 to 100 $\mu$m are to be used.

The inlet and outlet ports of the air jacket 49 are connected to the inlet and outlet ports, respectively, of a gas supply device 50 through pipes. When a gas heated or cooled to a predetermined temperature is circulated between the air jacket 49 and the gas supply device 50, the air jacket 49 and hence the positioning plates 47 and 48 can be set at a predetermined temperature. The temperature control mechanism of the probe card 32, especially of the positioning plates 47 and 48, is constituted by the gas supply device 50, a controller 51, and a temperature sensor 53. The gas supply device 50 causes the air jacket 49 to perform cooling or heating to a desired temperature on the basis of an output signal from the controller 51. The controller 51 outputs a signal in response to a temperature detection signal supplied from the temperature sensor 53 for detecting the temperature of the probe support portion 34. In this embodiment, the output signal from the controller 51 controls the temperature or flow amount of the fluid to be supplied to the air jacket 49.

A heater/cooler or air jacket 69 for selectively heating the support ring 30 to a predetermined temperature by a temperature control mechanism is formed in the support ring 30 as well. The inlet and outlet ports of the heater/cooler 69 are connected to the outlet and inlet ports, respectively, of a gas supply device 70 through pipes. When a gas heated or cooled to a predetermined temperature is circulated between the heater/cooler 69 and the gas supply device 70, the support ring 30 can be set at a predetermined temperature. The gas supply device 70 causes the heater/cooler 69 to perform cooling or heating to a desired temperature on the basis of an output signal from a controller 71. The controller 71 outputs a signal in response to a temperature detection signal supplied from a temperature sensor 73 for detecting the temperature of the support ring 30. In this embodiment, the output signal from the controller 71 controls the temperature or flow amount of the fluid to be supplied to the heater/cooler 69.

One example of the probe 37 will be described with reference to FIGS. 3 and 4.

Figure 3:
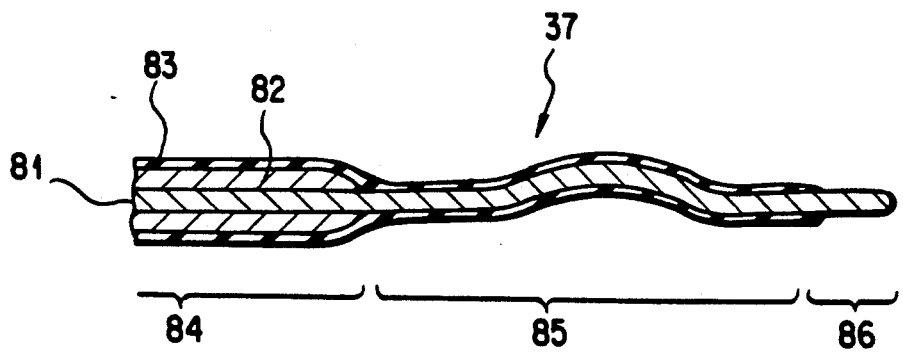
FIG. 3 is a sectional view of an arrangement of a probe.

As shown in FIG. 3, this probe 37 is constituted by a wiring portion 84, a buckle portion 85, and a distal end portion 86. The wiring portion 84 is obtained by sequentially forming a conductive layer 82 made of, e.g., copper to decrease the conductor resistance and an insulating layer 83 formed thereon, on the outer surface of a core wire 81 made of, e.g., Au-Cu, W Pd-Ag, and Be-Cu. The buckle portion 85 is capable of buckling and obtained by directly forming only the insulating layer 83 on the outer surface of the core wire 81. The core wire 81 is exposed from the distal end portion 86. The buckle portion 85 is located in the through hole portion 45a in the upper portion 45 to impart a spring function to the probe 37. As a result, the distal end portion 86 is movable in the vertical direction.

Figure 4:
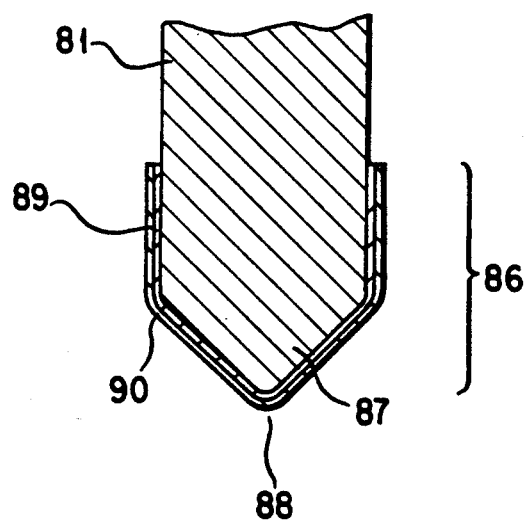
FIG. 4 is a sectional view showing the distal end portion of the probe shown in FIG. 3.

A tip 87 of the distal end portion 86 of the probe 37 forms a substantially conical shape having a vertex of, e.g., about 90°, as shown in FIG. 4. A flat portion 88 having a diameter of about 10 to 20 $\mu$m is formed at the central portion of the tip 87. The tip 87 and a portion of the core wire 81 near the tip 87 are covered with an Au plating layer 90 having a thickness of about 0.5 $\mu$m through an undercoating plating layer 89 made of, e.g., Ni having a thickness of about 0.5 $\mu$m. The Au plating layer 90 formed on the surface of the flat portion 88 electrically contacts an electrode pad when testing measurement of the semiconductor device is to be performed, so that the contact resistance between the electrode pad and the Au plating layer 90 is decreased.

The operation of the probe apparatus having the arrangement described above will be described.

The probe card 32 having the probes 37 matching the arrangement of the electrode pads 10a of the semiconductor devices of the semiconductor wafer 10 to be subjected to testing measurement is supported by the support ring 30. The air jackets 39 and 49 of the probe card 32 are connected to the corresponding temperature control mechanisms. When measurement is to be performed at a high temperature, the probe card 32 is heated to a predetermined temperature within 70° to 100° C. in advance. At the same time, the support ring 30 and the vacuum chuck 17 are connected to the corresponding temperature control mechanisms so as to be heated to 50° C. and a fixed temperature within 70° to 100° C., respectively. In this state, the semiconductor wafer 10 supported on the wafer rest table 11 is moved in the horizontal direction to align the electrode pads 10a with the tips of the probes 37 of the probe card 32. Subsequently, the wafer rest table 11 is moved in the Z direction to move the semiconductor wafer 10 upward until the electrode pads 10a abut against the tips of the probes 37. The wafer rest table 11 is over-driven to shift the tips of the probes 37 slightly upward. Upward shift of the probes 37 is achieved when the buckle portions 85 of the probes 37 located in the central through hole portion 45a buckle, as described above. In this state, electrical connection between the electrode pads 10a and the tips of the probes 37 become possible. Since the electrode pads 10a can be electrically connected to the tester (not shown) provided outside the probe apparatus through the printed board portion 33, the electrode pads 10a can be tested.

With the probe apparatus having the arrangement described above, during a high-temperature testing measurement, since the probe card 32 and the support ring 30 are heated in advance to corresponding temperatures as that of the heated semiconductor wafer 10, the probe card 32 will not be deformed by the heat from the semiconductor wafer 10 to positionally displace the tips of the probes 37, and the probes 37 and the electrode pads 10a can be brought into electrical contact with each other with a high precision. Since the horizontal shift of the tips of the probes 37 is controlled by, for example, the air jacket 49, the positional displacement of the probes 37 with respect to the electrode pads 10a can be prevented.

In this embodiment, the means for heating or cooling the respective components of the probe car mechanism is not limited to means using a fluid, e.g., a gas as described above, but can use electrical means, e.g., a coil.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A probe apparatus comprising:
   vertically movable wafer placing means for placing a semiconductor wafer having at least one semiconductor device formed thereon, a large number of electrode pads being formed on an upper surface of said semiconductor device;
   first temperature control means for setting the wafer placed on said wafer placing means at a predetermined temperature;
   a probe card located above said wafer placing means and having an electrical wiring portion, probes, and support means, said probes having vertical portions which are connected to said wiring portion, which extend downward substantially vertically, and which have lower end portions, upper end portions, and intermediate portions located between said lower and upper end portions and capable of buckling, and said support means carrying said electrical wiring portion, supporting said upper end portions of said vertical portions of said probes, and having a space in which said intermediate portions of said vertical portions are located;
   second temperature control means for setting said lower end portions of said vertical portions of said probes at a predetermined temperature;
   a first positioning plate supported by said support means and having a large number of through holes in which said lower end portions of said vertical portions of said probes are movably inserted, wherein said second temperature control means sets portions of said probes at said positioning plate at a predetermined temperature;
   a second positioning plate which is supported by said support means, has a large number of through holes in which said lower end portions of said vertical portions of said probes are movably inserted, and which is positioned above said first positioning plate with a predetermined gap therefrom, said first and second positioning plates and said support means defining a temperature control chamber, wherein said second temperature control means has a heating medium located in said temperature control chamber;
   wherein said heating medium is a fluid heated or cooled to the predetermined temperature; and
   wherein said second temperature control means has means for supplying and discharging said fluid to and from said temperature control chamber.

2. An apparatus according to claim 1, further comprising third temperature control means for setting a portion of said support means near said electrical wiring portion at the predetermined temperature.

3. An apparatus according to claim 2, further comprising means for supporting said probe card to oppose said wafer placing means, and fourth temperature control means for setting said probe card support means at the predetermined temperature.

4. An apparatus according to claim 1, wherein a gold plating layer is formed on a surface of a lower end of said vertical portion of each of said probes. wherein said heating medium is a fluid heated or cooled to the predetermined temperature; and
   wherein said second temperature control means has means for supplying and discharging said fluid to and from said temperature control chamber.

5. A probe apparatus comprising:
   vertically movable wafer placing means for placing semiconductor wafer having at least one semiconductor device formed thereon, the semiconductor device having a large number of electrode pads;
   first temperature control means for cooling the wafer placed on the wafer placing means;
   a probe card located above the wafer placing means and having an electrical wiring portion, probes electrically connected to the wiring portion, and support means for supporting the wiring portion and the probes, said support means and having a space and a bottom face facing the wafer placing means, each of said probes having an upper portion supported by the supporting means, an intermediate portion vertically extended and located in the space and a lower portion downwardly extending from the space, the space having an open end in the bottom face of the supporting means;
   a positioning plate attached to the support means to close the open end of the space thereof and having a large number of through holes which the lower ends of the probes vertically extend toward the wafer placing means;
   means for supplying a cooling fluid into the space for cooling the probes; and
   means for discharging the cooling fluid from the space;
   whereby the cooling fluid is discharged from the space through the discharging means without substantially contacting of the cooling fluid against the semiconductor wafer.

6. An apparatus according to claim 5, wherein said cooling fluid supplying means includes means for supplying a cooling gas into the space to cool the probes.

7. An apparatus according to claim 5, wherein said cooling fluid supplying means includes for controlling the temperature of the cooling gas.

8. A probe apparatus comprising:
   vertically movable wafer placing means for placing a semiconductor wafer having at least one semiconductor device formed thereon, the semiconductor device having a large number of electrode pads;

first temperature control means for selectively cooling and heating the wafer placed on the wafer placing means;

a probe card located above the wafer placing means and having an electrical wiring portion, probes electrically connected to the wiring portion, and support means for supporting the wiring portion and the probes, said support means and having a space and a bottom face facing the wafer placing means, each of said probes having an upper portion supported by the supporting means, an intermediate portion vertically extended and located in the space and a lower portion downwardly extending from the space, the space having an open end in the bottom end face of the supporting means;

a positioning plate attached to the support means to close the open end of the space thereof and having a large number of through holes through which the lower ends of the probes are vertically extended toward the wafer placing means;

means for supplying a temperature controlling fluid into the space for selectively cooling and heating the probes; and means for discharging the temperature controlling fluid from the space;

whereby the temperature controlling fluid is discharged from the space through the discharging means without substantially contacting of the cooling fluid against the semiconductor wafer.

9. An apparatus according to claim 8, further comprising a first sensor for sensing the temperature of the wafer placing means to control the temperature thereof, and a second sensor for sensing the temperature of fluid in the space to control the temperature thereof.

* * * * *